(12) United States Patent
Saeki et al.

(10) Patent No.: US 9,543,204 B2
(45) Date of Patent: Jan. 10, 2017

(54) METHOD FOR MANUFACTURING SEMICONDUCTOR DEVICE

(75) Inventors: Yoshihiro Saeki, Chuo-ku (JP); Nobuaki Hoshi, Chuo-ku (JP)

(73) Assignee: Longitude Semicondutor S.A.R.L., Luxembourg (LU)

( * ) Notice: Subject to any disclaimer, the term of this patent is extended or adjusted under 35 U.S.C. 154(b) by 0 days.

(21) Appl. No.: 13/455,840

(22) Filed: Apr. 25, 2012

(65) Prior Publication Data

US 2012/0276733 A1   Nov. 1, 2012

(30) Foreign Application Priority Data

Apr. 27, 2011   (JP) .................. 2011-100099

(51) Int. Cl.
| | |
|---|---|
| *H01L 21/768* | (2006.01) |
| *H01L 21/288* | (2006.01) |
| *H01L 25/065* | (2006.01) |
| *H01L 25/00* | (2006.01) |

(52) U.S. Cl.
CPC ..... *H01L 21/76898* (2013.01); *H01L 21/2885* (2013.01); *H01L 25/0657* (2013.01); *H01L 25/50* (2013.01); *H01L 2224/16145* (2013.01); *H01L 2224/16225* (2013.01); *H01L 2224/32145* (2013.01); *H01L 2224/32225* (2013.01); *H01L 2224/73204* (2013.01); *H01L 2225/06513* (2013.01); *H01L 2225/06517* (2013.01); *H01L 2225/06541* (2013.01); *H01L 2225/06565* (2013.01); *H01L 2924/15311* (2013.01)

(58) Field of Classification Search
CPC .............. H01L 21/76898; H01L 25/50; H01L 25/0657; H01L 21/2885

USPC ............. 438/674, 675, 612, 613, 652, 658; 257/E21.575

See application file for complete search history.

(56) References Cited

U.S. PATENT DOCUMENTS

| | | | | |
|---|---|---|---|---|
| 4,851,311 | A * | 7/1989 | Millis et al. ................... | 430/30 |
| 5,274,401 | A * | 12/1993 | Doggett et al. ............... | 347/148 |
| 5,688,634 | A * | 11/1997 | Mixon et al. ................. | 430/296 |
| 6,342,447 | B1 * | 1/2002 | Hoshino ....................... | 438/687 |
| 6,541,301 | B1 * | 4/2003 | Raymond ..................... | 438/106 |

(Continued)

FOREIGN PATENT DOCUMENTS

| | | |
|---|---|---|
| JP | 2000080496 A | 3/2000 |
| JP | 2003007595 A | 1/2003 |

(Continued)

OTHER PUBLICATIONS

Human Translation of paragraph [0059] of JP application 2011-100099 (date of application Apr. 27, 2011).*

*Primary Examiner* — Michele Fan

(57) ABSTRACT

In order to provide a semiconductor device that includes a conductive layer on one surface of a semiconductor substrate with an insulating layer therebetween, a bump on the other surface of the semiconductor substrate, and a through-electrode through the semiconductor substrate connecting the conductive layer with the bump, a through-hole is formed from the other surface of the semiconductor substrate to be connected to the conductive layer, a seed metal film is formed on the through-hole and the other surface, a photoresist is formed thereon, a mask layer is formed by processing the photoresist with a pattern larger than the through-hole, a plated film is grown by electrolytic plating so as to integrally form the through-electrode and a part of the bump.

15 Claims, 11 Drawing Sheets

(56) References Cited

U.S. PATENT DOCUMENTS

| | | | |
|---|---|---|---|
| 6,716,737 B2* | 4/2004 | Plas et al. | 438/612 |
| 6,811,955 B2* | 11/2004 | Wu et al. | 430/311 |
| 7,319,944 B2* | 1/2008 | Nakamura et al. | 703/6 |
| 2004/0032024 A1* | 2/2004 | Lee et al. | 257/734 |
| 2004/0209399 A1* | 10/2004 | Sunohara | H01L 21/76898 438/108 |
| 2004/0248405 A1* | 12/2004 | Fukunaga et al. | 438/637 |
| 2005/0003649 A1* | 1/2005 | Takao | 438/612 |
| 2005/0046002 A1* | 3/2005 | Lee | H01L 21/76898 257/678 |
| 2005/0101040 A1* | 5/2005 | Lai et al. | 438/21 |
| 2005/0136568 A1* | 6/2005 | Fukazawa | 438/106 |
| 2005/0148172 A1* | 7/2005 | Cohen | 438/643 |
| 2005/0167830 A1* | 8/2005 | Chang et al. | 257/737 |
| 2008/0265411 A1* | 10/2008 | Hu | 257/737 |
| 2009/0014843 A1* | 1/2009 | Kawashita et al. | 257/621 |
| 2009/0061629 A1* | 3/2009 | Preusse et al. | 438/680 |
| 2009/0068831 A1* | 3/2009 | Enquist et al. | 438/618 |
| 2009/0189256 A1* | 7/2009 | Yoshimura et al. | 257/621 |
| 2009/0261457 A1* | 10/2009 | Pratt | H01L 21/76898 257/621 |
| 2009/0291554 A1* | 11/2009 | Lin et al. | 438/614 |
| 2009/0305502 A1* | 12/2009 | Lee et al. | 438/667 |
| 2009/0309224 A1* | 12/2009 | Lin et al. | 257/758 |
| 2010/0015805 A1* | 1/2010 | Mayer et al. | 438/692 |
| 2010/0078776 A1* | 4/2010 | Barth et al. | 257/659 |
| 2010/0096750 A1* | 4/2010 | Shih et al. | 257/738 |
| 2011/0095373 A1* | 4/2011 | Hwang et al. | 257/368 |
| 2011/0101539 A1* | 5/2011 | Kato | 257/774 |
| 2011/0133333 A1* | 6/2011 | Kwon | H01L 21/76898 257/737 |
| 2011/0312128 A1* | 12/2011 | Kim et al. | 438/107 |
| 2012/0074584 A1* | 3/2012 | Lee | H01L 21/76898 257/774 |
| 2012/0091583 A1* | 4/2012 | Kawashita et al. | 257/737 |
| 2013/0015585 A1* | 1/2013 | Kosenko et al. | 257/774 |
| 2013/0140688 A1* | 6/2013 | Chen et al. | 257/737 |
| 2013/0285257 A1* | 10/2013 | Lee | H01L 24/03 257/774 |

FOREIGN PATENT DOCUMENTS

| | | |
|---|---|---|
| JP | 2005221801 A | 8/2005 |
| JP | 2007242693 A | 9/2007 |
| JP | 2010010557 A | 1/2010 |
| JP | 2010272737 A | 12/2010 |

* cited by examiner

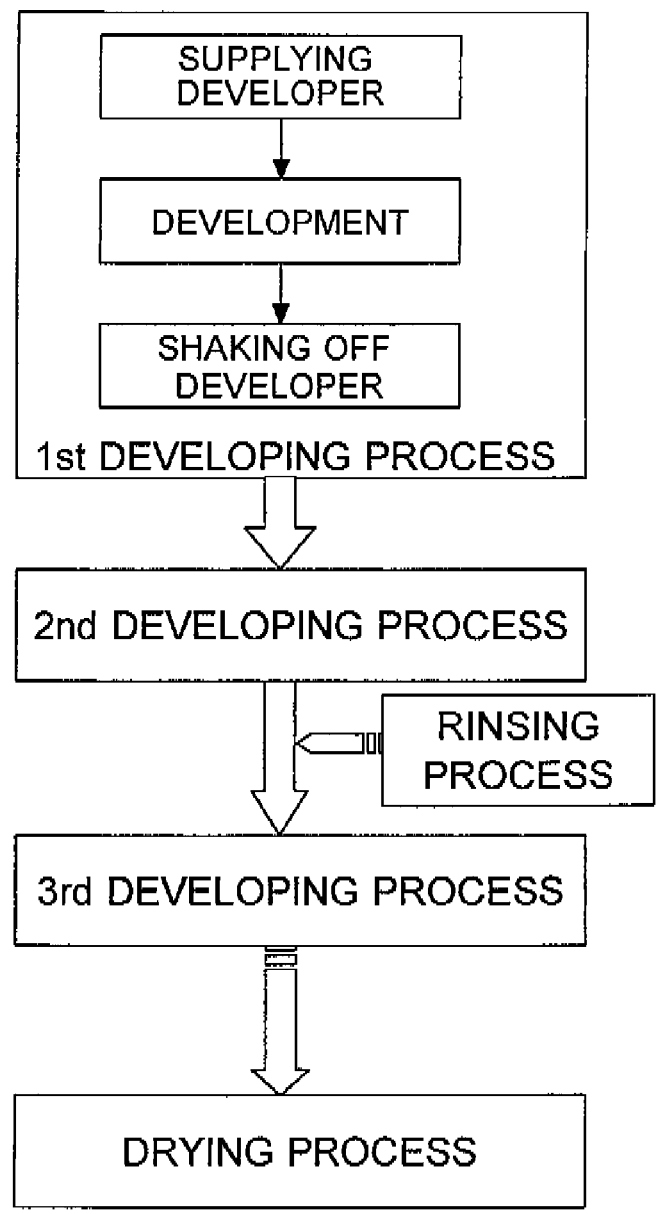

METHOD FOR MANUFACTURING SEMICONDUCTOR DEVICE

BACKGROUND OF THE INVENTION

Field of the Invention

The present invention relates to a method for manufacturing a semiconductor device including a through-electrode connecting conductive layers formed on one and the other surfaces of a semiconductor substrate, and a method for forming the through-electrode.

Related Art

As a technology for achieving additional high integration and high performance of semiconductor integrated circuits, there is a technology of stacking semiconductor chips with which a conductive layer provided on the main surface of the upper semiconductor chip is electrically connected to a conductive layer provided on the main surface of the lower semiconductor chip by a through-electrode formed in the upper semiconductor chip and in contact with the conductive layer of the upper semiconductor chip, and a bump between the through-electrode and the conductive layer of the lower semiconductor chip. Since the conductive layers are connected in the thickness direction of the semiconductor chip through the through-electrode and the bump, it is possible to greatly reduce the wiring length in comparison to outer wire connection and to transmit/receive a large number of signals by micro-fabrication, so that this technology is advantageous to achieve high performance.

The following technologies are known in the art, for a method of forming a through-electrode and the structure of the through-electrode.

Patent Document 1: JP-A-2009-124087
Patent Document 2: JP-A-2009-295851
Patent Document 3: JP-A-2008-53568

The technology described in Patent Document 1 includes forming a through-hole in a semiconductor substrate, plating copper in the through-hole, removing the copper on the surface of the semiconductor substrate by using a CMP method to complete a through-electrode, and then separately forming a bump by using a resist as a mask. The through-electrode is formed to have a plane shape or size in the view point of prevention of internal stress independently of the shape and size of the bump that is necessary for stacking the semiconductor chips. As a result, it is possible to completely individually adjust them. In generally, it is preferable to make the bump having a footprint larger than that of the through-electrode and thus an individual photolithography is generally used.

In the technologies described in Patent Documents 2 and 3, a conductive layer on an insulating film formed on the surface of a semiconductor chip and a through-electrode formed in the chip are connected through an opening formed in the insulating film, but the opening is smaller in diameter of the through-electrode, and the through-electrode and the bump are integrally formed. The through-electrode and the bump are formed by electroless plating, using a metal layer (conductive layer) exposed by the opening as a seed layer or using a seed layer covering the bottom of a through-hole. As a result, a plated layer is selectively formed in the through-hole without depositing a plated layer on the chip. Therefore, the number of manufacturing processes is less than the case of Patent Document 1. In addition, since the through-electrode and the bump are integrally formed, it is possible to accomplish low electric resistance.

In the technology described in Patent Document 1, the through-electrode and the bump are individually formed so that the processing of these components is long. Particularly, since it is necessary to remove the plated metal (copper) on the chip surface when forming the through-electrode, a CMP process that is expensive is necessary, which is economically unfavorable. Further, a barrier layer and a seed layer which have relatively large resistance are disposed between the through-electrode and the bump and the interface resistance is generated between the layers, such that it is difficult to sufficiently reduce electric resistance.

The through-electrode and the bump are formed by electroless plating after exposing the metal layer by the opening as a seed layer in the technology described in Patent Document 2, while after forming a seed layer on the bottom of the through-hole in contact with a contact plug connected to the metal layer through the insulating layer in the technology described in Patent Document 3. According to the electroless plating, the shape and size of them depend on the shape of the through-hole and cannot be individually adjusted. In Patent Documents 2 and 3, the diameters of the through-electrode and the bump are substantially the same, and accordingly, large internal stress is exerted in the wider through-electrode, such that a void may be generated by stress migration. Further, the speed forming a film is low in electroless plating, which cannot be considered as a preferable method for the productivity.

SUMMARY

According to a first embodiment of the present invention, there is provided a method for manufacturing a semiconductor device, which includes: forming a conductive layer on one surface of a semiconductor substrate interposed an insulating layer therebetween; forming a through-hole from the other surface of the semiconductor substrate to be connected to the conductive layer; depositing a seed metal layer on the other surface of the semiconductor substrate and on the inner surface of the through-hole; forming a plating mask layer having an opening larger than the through-hole in diameter and exposing an opening of the through-hole on the other surface of the semiconductor substrate; and growing a first plated film in the through-hole and the opening portion of the plating mask layer by electrolytic plating using the plating mask layer as a mask so as to integrally form a through-electrode portion in the through-hole and a first bump portion in the opening of the plating mask layer.

According to an embodiment of the present invention, it is possible to freely determine the plan shapes and sizes (cross-sectional areas) of the through-electrode and the bump, and to continuously and integrally form the through-electrode and the bump. As a result, it is possible to reduce internal stress that causes a void due to stress migration of the conductive layer where the through-electrode is formed, and decrease electric resistance.

Further, it is possible to improve production efficiency because a film is formed faster in electrolytic plating than electroless plating.

BRIEF DESCRIPTION OF THE DRAWINGS

The above features and advantages of the present invention will be more apparent from the following description of certain preferred embodiments taken in conjunction with the accompanying drawings, in which:

FIG. 3 is a flowchart illustrating a process of removing a resist in a TSV.

DETAILED DESCRIPTION OF THE REFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

First Exemplary Embodiment

Figure 1:
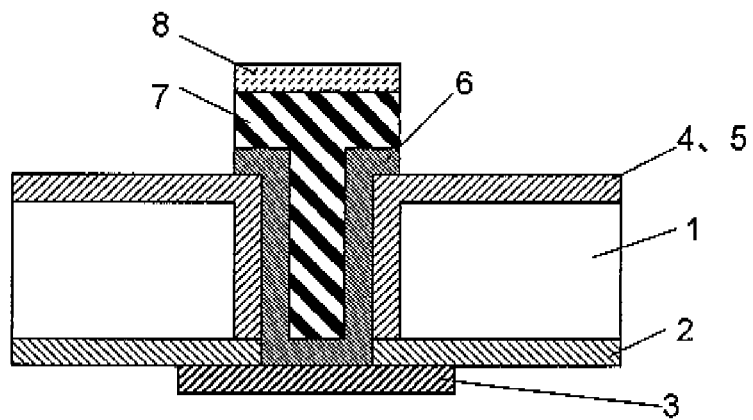
FIG. 1 is a schematic longitudinal cross-sectional view showing the structure of a semiconductor device according to a first embodiment of the present invention.

FIG. 1 shows the structure of a semiconductor device according to a first exemplary embodiment. An embodiment of an insulating layer liner type of a through-electrode is shown in the figure.

Meanwhile, a through-electrode is mainly described herein and other structures of the semiconductor device which do not largely relate to the present invention are not described.

A semiconductor device of this exemplary embodiment includes a first insulating film 2 and a conductive layer 3 (referred to as a pad) which are disposed on one surface of a silicon substrate 1, a through-hole (Through silicon via, referred to as TSV) formed from the other surface of the silicon substrate 1, a second insulating film 4 and a third insulating film 5 which cover the other surface of the silicon substrate 1 and the side facing the TSV, and a barrier metal and a seed metal (totally referred to as a metal film 6), a first plated film 7, and a second plated film 8. The portion of the first plated film 7 which passes through the silicon substrate 1 is a through-electrode portion, and the metal film 6, the first plated film 7 over the other surface of the silicon substrate 1, and the second plated film 8 constitute a bump portion.

Figure 2A:
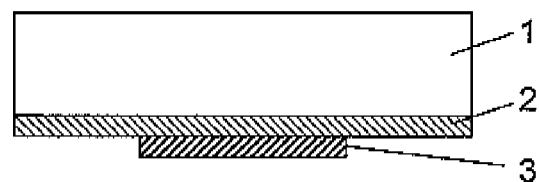
FIGS. 2A to 2N are cross-sectional views showing the processes of a method for manufacturing the semiconductor device according to the first exemplary embodiment.
Figure 2B:
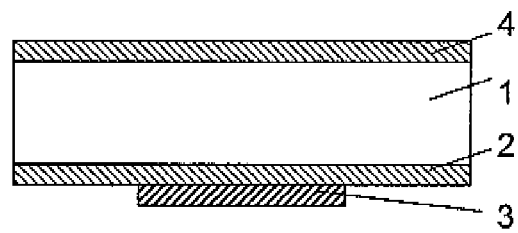
Figure 2C:
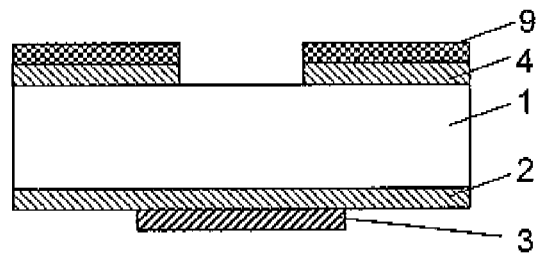
Figure 2D:
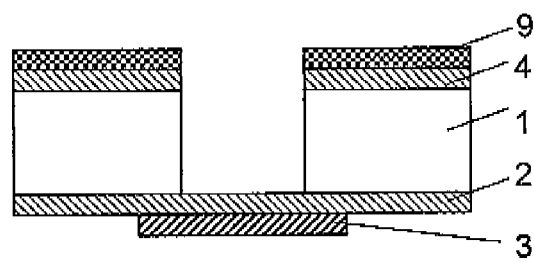
Figure 2E:
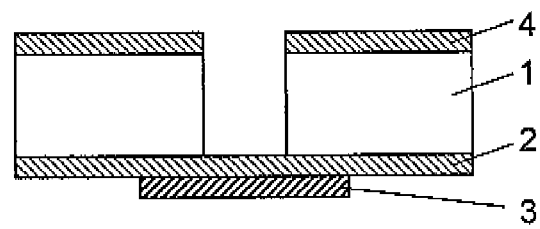
Figure 2F:
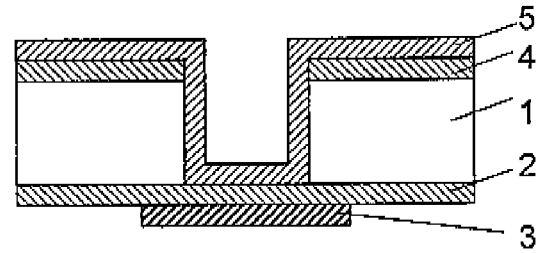
Figure 2G:
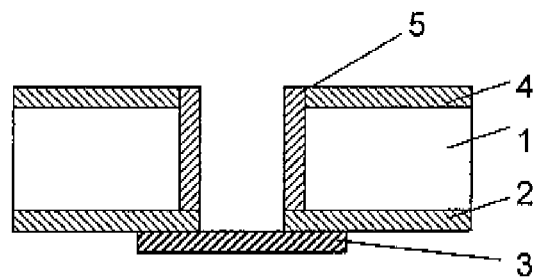
Figure 2H:
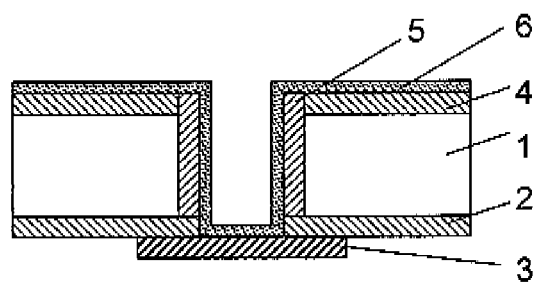
Figure 2I:
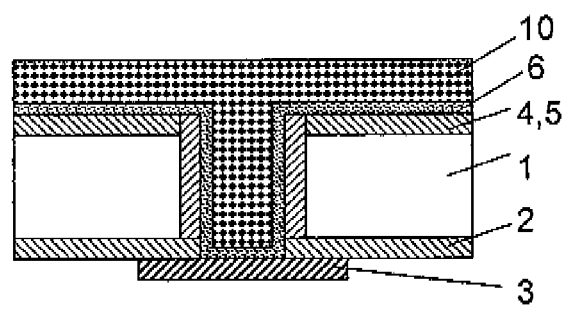
Figure 2J:
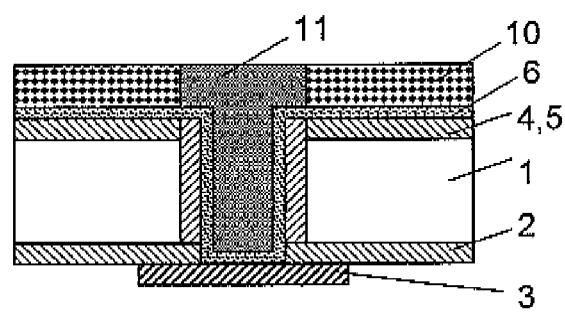
Figure 2K:
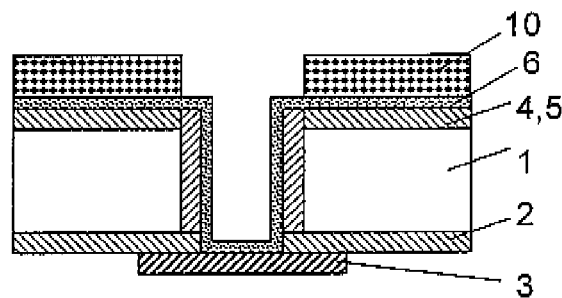
Figure 2L:
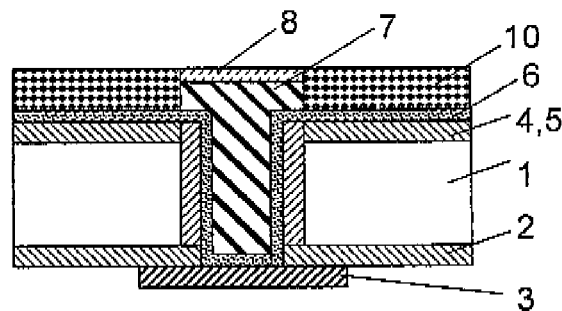
Figure 2M:
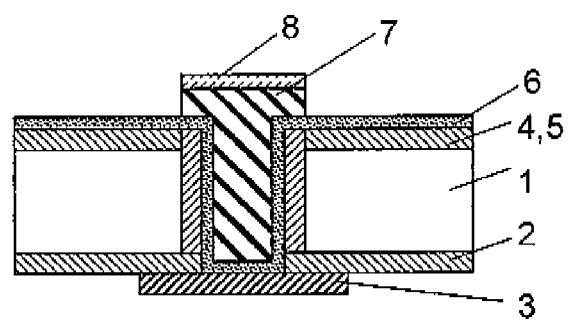
Figure 2N:
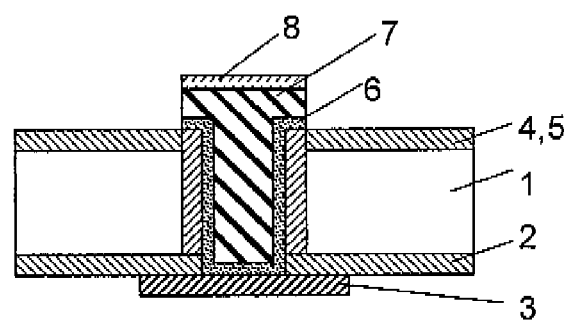

FIGS. 2A to 2N are cross-sectional views showing the processes of a method for manufacturing the semiconductor device according to the first exemplary embodiment.

As shown in FIG. 2A, a silicon substrate 1 with a first insulating film 2 and a pad 3 which is a conductive layer on one surface is prepared.

As shown in FIG. 2B, a second insulating film 4 is formed on the other surface of the silicon substrate 1.

As shown in FIG. 2C, a TSV pattern is formed by applying, exposing, and developing a first photoresist 9 on the second insulating film 4.

As shown in FIG. 2D, a first through-hole is formed by using a pattern of the first photoresist 9 as a mask. The first through-hole is formed by dry etching.

As shown in FIG. 2E, the first photoresist 9 is removed after the first through-hole is formed.

As shown in FIG. 2F, a third insulating film 5 is formed from the side where the first through-hole is formed.

As show in FIG. 2G, a second through-hole (TSV) is formed by etching back the third insulating layer 5 with dry etching from the side where the first through-hole is formed, and then etching back the first insulating film 2.

As shown in FIG. 2H, a metal film 6 including a barrier metal and a seed metal is deposited by a sputtering from the side where the TSV is formed. In this exemplary embodiment, the battier metal is made of Ti and the seed metal is made of Cu.

As shown in FIG. 2I, a second photoresist 10 is applied from the side where the TSV is formed. As the second photoresist 10, a positive photoresist is applied by spin coating.

As shown in FIG. 2J, the second photoresist 10 is exposed from the side where the TSV is formed so as to form an exposure portion 11 that fits a shape of a bump to be formed.

As shown in FIG. 2K, the exposure portion 11 is removed through development from the side where the TSV so as to form an opening portion of the second photoresist 10. The remained second photoresist 10 is called as a plating mask layer. The development is performed step by step, but residues in the TSV are securely removed by increasing the number of times.

The process of removing the residues in the TSV is described in detail.

In the related art, it is very difficult to completely remove a resist material in a considerably deep hole such as TSV. The technologies described in Patent Documents 1 to 3 do not include a process of removing a resist material in such a deep hole.

Since a defect may be cause in a film in an electrolytic plating process when residues remain in the TSV, it is necessary to clean the surface of the seed metal disposed in the TSV. Further, it is necessary to minimize damage to the plating mask layer (the second photoresist 10 remaining on the substrate surface). For example, when the shape of the side or the surface state of the plating mask layer is changed, the shape of the completed bump is influenced and it may be unfavorable.

FIG. 3 is a flowchart illustrating a process of developing the second photoresist 10.

In general, the developing process includes a step of supplying a developer onto a silicon wafer from a nozzle while rotating the silicon wafer at a low speed, a step of performing development with the rotation of the silicon wafer stopped and the developer kept on the silicon wafer, and a step of shaking off the developer from the silicon wafer by rotating the silicon wafer again at a low speed.

In this exemplary embodiment, it was possible to remove residues of the resist material in the TSV by repeating the developing process composed of the above three steps, five times.

In this case, it is more effective to reduce the concentration of the developer used in the second and the following developing processes, less than the concentration of the developer used in the first developing process. Removing of the residues of the resist material in the TSV rather than developing is expected in the second and the following developing processes, which is because it is necessary to minimize damage to the plating mask layer remaining on the substrate surface. In more detail, the concentration of the developer may be reduced sequentially or step by step in the second and the following developing processes.

Further, it was effective to insert a rinsing process with water between the developing processes. It is possible to increase the removal effect by inserting the rinsing process of removing the residues in the TSV between the developing processes. Further, the same effect is achieved even alternately performing a developing process and a rinsing process of removing the residues in the TSV. It is possible to supply pure water from a nozzle onto the silicon wafer that rotates in the rinsing process, but high rotation speed may be effective rather than low rotation speed. Further, it is possible to give ultrasonic vibration or apply high-frequency voltage by disposing an electrode around the silicon wafer. It is possible to achieve an expected effect to insert one rinsing process between the developing processes, but the rinsing process can be inserted several times to achieve more preferable efficiency. Although each developing process composed of three steps is described in detail, the same operation effect may be achieved even if other developing methods known in the art are applied.

The development is finished by performing a drying process that rotates the silicon wafer at a high speed after performing the series of developing processes.

In the first exemplary embodiment, it is possible to securely remove the residues of the resist material in the TSV by performing the developing process several times, and the growing the first plated film 7 to integrally form the through-electrode and the bump can be performed by electrolytic plating without any problems. As a result, it is possible to omit CMP of a plated layer that is performed after the through-electrode is plated in the related art, the process of forming barrier metal and a seed metal for a separated bump after the CMP, and photolithography after pattering the separated bump.

Further, it is also possible to reduce the amount of use of the developer by reducing the number of times of the developing processes by inserting the rinsing process during the developing processes.

The following processes are performed after the resist in the TSV is securely removed.

As shown in FIG. 2L, a Cu film, as the first plated film 7, is formed by electrolytic plating, from the side where the TSV is formed. The remaining second photoresist 10 becomes a plating mask layer. The through-electrode portion and the bump portion are formed by the first plated film 7 in this configuration. The bump portion integrally formed with the through-electrode portion is called a first bump portion. Meanwhile, in the present invention, the term "integrally formed" means that components are continuously made of the same material, does not mean that components are integrally made of different materials with a joint. Further, an SnAg film is formed, as the second plated film 8, by electrolytic plating. The bump portion formed by the second plated film 8 is called a second bump portion.

As shown in FIG. 2M, the second photoresist (mask layer) 10 is removed.

As shown in FIG. 2N, the metal film 6 composed of the barrier metal and seed metal is removed. The metal film 6 under the first bump portion (first plated film 7) and on the surface of the silicon substrate is called a third bump portion.

The process of forming the through-electrode portion by embedding a metal material in the TSV formed in the silicon substrate by using electrolytic plating, and of integrally and continuously forming the first bump portion on the through-electrode portion is described in detail.

It should be noted to prevent a dent or a projection from being formed on the surface of the first plated film 7 (first bump portion) when integrally forming the through-electrode portion and the first bump portion. A recession or a projection on the surface of the first plated film 7 may cause a problem, such as abnormal growth when the second plated film 8 (second bump portion) is formed in the following processes.

In general, the plating solution that is used in electrolytic plating is composed of a basic solution containing metal material ions for forming a film, and an additive. The additive contains a catalyst and an inhibitor, which play important roles when embedding a metal material in a deep hole, such as, forming a through-electrode. It is possible to accelerate film-growing in the hole and achieve an optimal plating film-growing condition for embedding in a deep hole while decreasing a film-growing rate on the surface of the silicon substrate by appropriately setting the mixture ratio. Further, it is possible to obtain a desired plating film-growing property based on the mixture ratio. In this case, the film-growing condition for achieving a desired film-growing property also depends on the diameter or the aspect ratio of a hole and a current density applied in film-growing.

A plating film-growing condition that a film-growing rate around the substrate surface and the upper opening of the TSV is strongly decreased and a film-growing rate toward the opening of the hole from the bottom of the hole is increased is defined as a "high-rate embedding plating film-growing condition", and a plating film-growing condition where a predetermined film-growing rate is achieved by weakening the decreasing of the film-growing rate around the substrate surface and the upper opening of the TSV is defined as a "conformal plating film-growing condition".

In detail, the "high-rate embedding plating film-growing condition" is a film-growing condition in which the film upwardly growing in the depth direction of the through-hole reaches the substrate surface before the opening is closed with the film horizontally growing around the opening. When the radius of the TSV (after the metal film 6 is formed) is R, the depth of the TSV is d, an average film-growing rate horizontally growing around the opening of the TSV is r1, and an average film-growing rate upwardly growing in the depth direction of the TSV is r2, the relation of $d/r2 \leq R/r1$ is a target for the "high-rate embedding plating film-growing condition". The "conformal plating film-growing condition" is a film-growing condition in which the opening is closed with the film horizontally growing around the opening before the film upwardly growing in the depth direction of the TSV reaches the surface substrate. That is, the relation of $d/r2 > R/r1$ is a target for the "conformal plating film-growing condition". However, these relations are described for the sake of convenience to explain the present invention, not describing in the related art. When the plane shape of the TSV is a regular polygon, R is defined as the radius of an inscribed circle of the TSV having such a plane shape after the metal film 6 is formed.

Next, the process of continuously and integrally forming the through-electrode portion and the bump portion (first bump portion) is described with reference to drawings.

Figure 4:
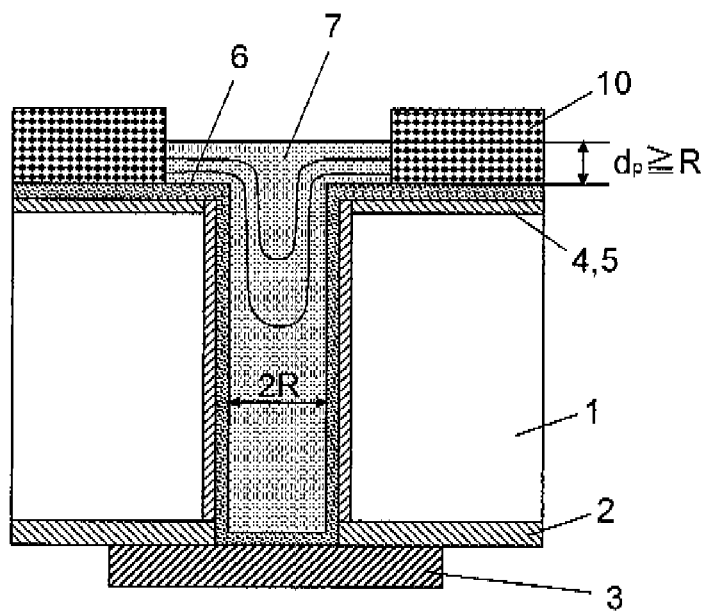
FIG. 4 is a conceptual diagram showing an example of continuously and integrally forming a through-electrode and a bump by using an embedding-plating film-growing condition with a high rate, and illustrating how a film is formed as time passes.

FIG. 4 shows an example of continuously and integrally forming a through-electrode portion and a bump portion by using the high-rate embedding plating film-growing condition, illustrating how a first plated film is formed as time passes. It is possible to achieve a substantially flat bump surface because a narrow dent is not easily formed, by continuously and integrally forming a through-electrode and a bump, using a film-growing condition in which the first plated film upwardly increasing in the depth direction of the through-hole reaches the substrate surface before the opening is closed with the first plated film horizontally increasing around the opening. In this case, the surface of the first plated film 7 becomes substantially flat when the film formed upward from the bottom reaches the substrate surface. In this configuration, the film formed horizontally around the opening is not closed, without reaching the center of the opening. Further, when the thickness $d_p$ of the bump is smaller than a desired thickness, it is possible to achieve a desired bump thickness while preventing a protrusion from being formed at the center portion of the bump by performing electrolytic plating of the second step which continuously forms a film with another electrolytic plating solution, such as by additionally changing the mixing ratio of the additive after the bump surface becomes substantially flat. In this process, it is preferable to use an optimum plating solution for plating the flat portion.

Figure 5A:
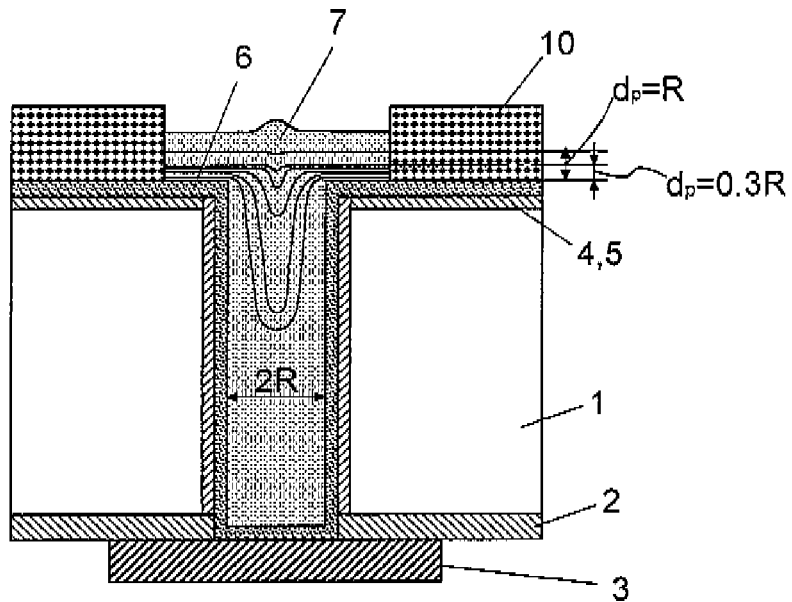
FIGS. 5A and 5B are conceptual diagrams showing an example of continuously and integrally forming a through-electrode and a bump by using a conformal plating film-growing condition, and illustrating how a film is formed as time passes (FIG. 5A) and a diagram showing a configuration in which the thickness of the bump is increased by a third plated film after a first plated film is formed until the center portion of the bump is planarized (FIG. 5B).

FIG. 5A shows an example of continuously and integrally forming a through-electrode portion and a bump portion by using the conformal plating film-growing condition, illustrating how a film is formed as time passes. In this case, a film is formed at some degree in the bump portion while a film is formed in the TSV, but a narrow dent is formed on the surface of the plated film. When the film is further formed and the thickness $d_p$ of the bump reaches the radius R of the TSV, the surface of the bump becomes flat. When the film is further formed, the center of the surface of the bump convexly protrudes, as shown in the figure.

According to an experiment of the inventions, it is optimal that the bump thickness $d_p$ is the same of the radius R of the TSV, but when the thickness is 30% or more of the radius of the TSV ($d_p \geq 0.3(R)$), the dent on the bump surface is within an allowable range. Further, when the thickness is 120% or less of the radius of the TSV, even if the surface is formed somewhat convexly with the thickness above the radius of the TSV, it is in the allowable range. Therefore, it is preferable that the first plated film 7 is formed such that the bump thickness is in the range of 30 to 120% of the radius of the TSV.

Figure 5B:
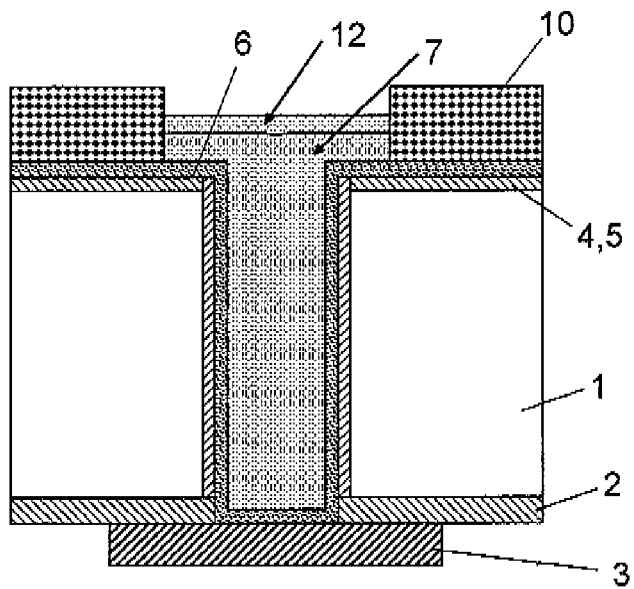

As shown in FIG. 5B, it is possible to increase the thickness of the bump while keeping the flatness of the bump surface, by stopping the first plated film 7 when the center of the surface of the bump becomes flat ($d_p = (R)$), and by performing electrolytic plating of the second step which continuously forms a third plated film (the same material as the first plated film) with another electrolytic plating solution, such as by additionally changing the mixing ratio of the additive. In this process, it is preferable to use an optimum plating solution for plating the flat portion.

The second plated film 8 that becomes the second bump portion is formed after forming the first bump portion (including the third plated film 12). The second bump portion has a shape where the shape of the side of the plating mask layer (second photoresist 10) is reflected and that has a wall substantially perpendicular to the plane of the silicon substrate 1.

In the first exemplary embodiment, the TSV is formed by using dry etching, but the TSV may be formed by wet etching. Further, the TSV may be formed by a laser ablation, not using the first photoresist 9.

In the first exemplary embodiment, the etch back of the third insulating film 5 and the formation of the opening in the first insulating film 1 are carried out by using dry etching, they may be carried out by wet etching or a laser ablation.

In the first exemplary embodiment, the through-holes in the third insulating film 5 and the first insulating film 2 is formed without patterning the photoresist, but it may be possible to form a pattern with a photoresist and then remove the photoresist.

In the first exemplary embodiment, the barrier metal is made of Ti and the seed metal is made of Cu, but they may be made of other materials that are conventionally used.

In the first exemplary embodiment, the photoresist film is formed by applying a photoresist with spin coating, but it may be formed by laminating a photosensitive resist film. The photosensitive resist film is possible to prevent a resist from coming into the TSV and to easily remove an indentor in the TSV, which is a dissolved material of the resist in development, by rinsing.

In the first exemplary embodiment, the positive photoresist is used as the second photoresist 10, but a negative photoresist may be used. In this case, the opening portion of the second photoresist 10 to be a template of the bump can be formed in a non-exposing portion and the remaining on the substrate is an exposing portion.

In the first exemplary embodiment, the through-electrode portion and the first bump portion are composed of the first plated film 7 by electrolytic copper plating, but the through-electrode portion and the first bump portion may be formed by other materials that can be electrolytic-plated. Copper plating is referable in terms of conductivity. The second plated film 8 is formed by electrolytic plating, but may be formed by electroless plating. As the second plates film, other than SnAg described above, a film containing Ni and Au, a film containing Ni, Pb, and Au, or lead-free solder may be used.

The first, second and third insulating films can be used by any of insulating materials, but a silicon oxide film with small stress is preferable because the first insulating film and the second insulating film are formed on the surface of the substrate. Further, the second insulating film may be a stacked film of a silicon oxide film and a silicon nitride film. Further, it is preferable that the third insulating film is a film having a barrier function that prevents diffusion of metal from the through-electrode to the silicon substrate, and preferably a film containing a silicon nitride film.

Second Exemplary Embodiment

Although the embodiment of an insulating layer liner type of a through-electrode having an insulating layer (third insulating film) on the side of the through-electrode is described in the first exemplary embodiment, the present invention is not limited thereto, and it may be possible to forming an insulative separating portion (insulating ring) around the through-electrode through from one surface to the other surface of a semiconductor substrate, in a region isolated from the through-electrode.

Figure 6A:
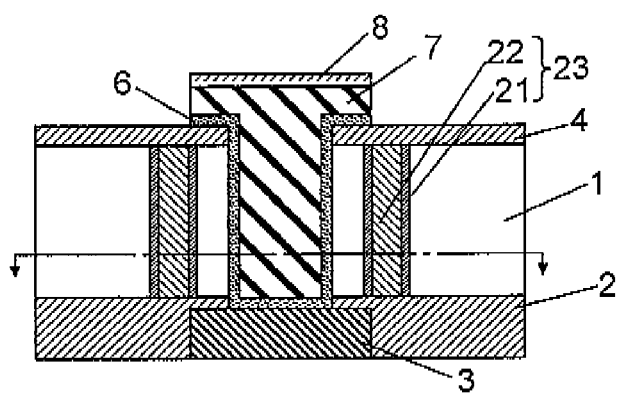
FIG. 6A is a schematic longitudinal cross-sectional view showing the structure of a semiconductor device according to a second exemplary embodiment of the present invention and FIG. 6B is a plan cross-sectional view.

FIG. 6A is a cross-sectional view showing a through-electrode with an insulating ring and other structures of the semiconductor device which do not largely relate to the present invention are not shown, similar to FIG. 1.

A semiconductor device of the second exemplary embodiment includes a first insulating film 2 and a pad 3 which are disposed on one surface of a silicon substrate 1, a TSV formed from the other surface of the silicon substrate 1, a second insulating film 4 covering the other surface of the silicon substrate 1, a metal layer 6 of a barrier metal and a seed, and a first plated film 7 and a second plated film 8. Further, a ring-shaped insulating layer (insulating ring 23) is formed around the TSV. The insulating ring 23 is composed of a silicon nitride film 21 and a silicon oxide film 22. The silicon nitride film 21 has a barrier function that prevents metal diffusion from the through-electrode to the semiconductor substrate 1.

FIGS. 7A to 7E are cross-sectional views showing the processes of a method for manufacturing the semiconductor device according to the second embodiment.

Figure 6B:
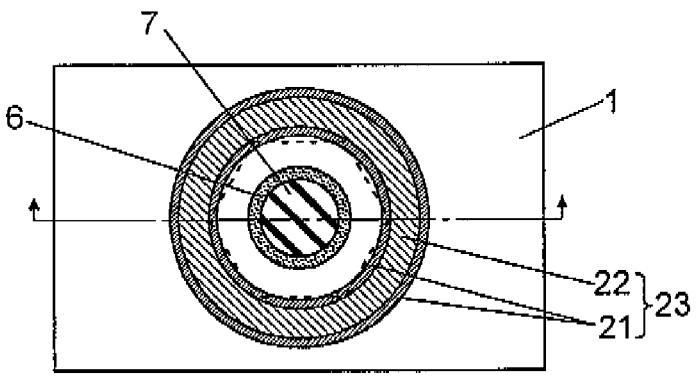
Figure 7A:
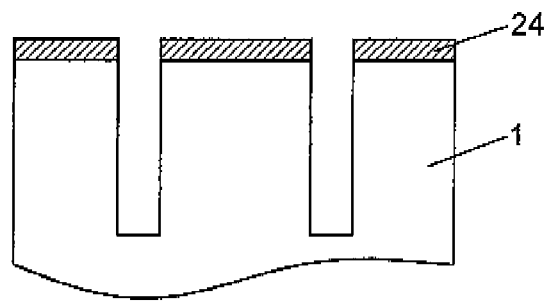
FIGS. 7A to 7E are cross-sectional views showing the processes of a method for manufacturing the semiconductor device according to the second exemplary embodiment.

First, as shown in FIG. 7A, a fourth insulating film 24 is formed on one surface of the silicon substrate 1 and a ring-shape trench for forming the insulating ring 23 is formed in the silicon substrate 1. The trench is formed, for example, with a width of 2 μm and a depth of 50 μm. Meanwhile, in the process of FIG. 7, the structure is turned upside down, opposite to that of FIG. 6.

Figure 7B:
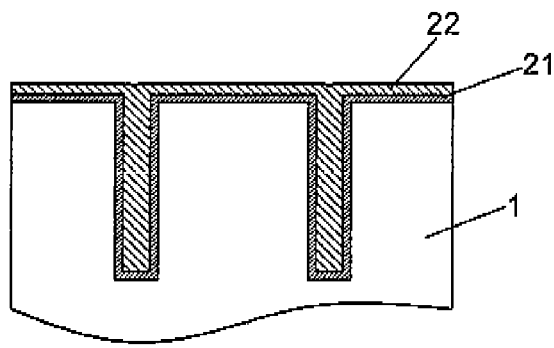

Next, as shown in FIG. 7B, a silicon nitride film 21 and a silicon oxide film 22 are formed on the surface of the silicon substrate 1 after the fourth insulating film 24 is removed.

Figure 7C:
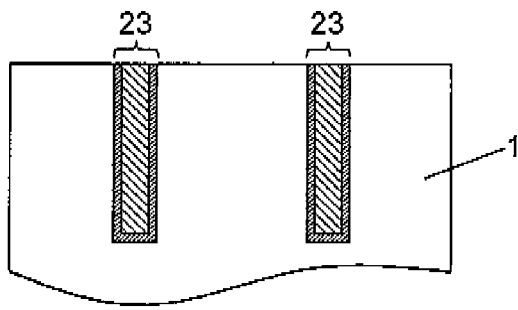

As shown in FIG. 7C, the surface of the silicon substrate 1 is exposed by CMP or the like and the insulating ring 23 composed of the silicon nitride film 21 and the silicon oxide film 22 is formed in the trench.

Figure 7D:
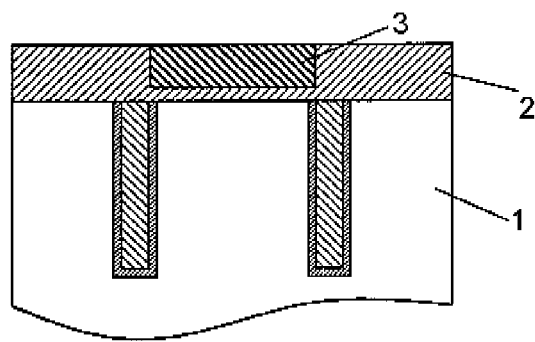

As shown in FIG. 7D, the first insulating film 2 and the pad 3 are disposed on the side at which the insulating ring 23 has been formed. In this exemplary embodiment, the pad 3 is embedded in the first insulating film 2.

Figure 7E:
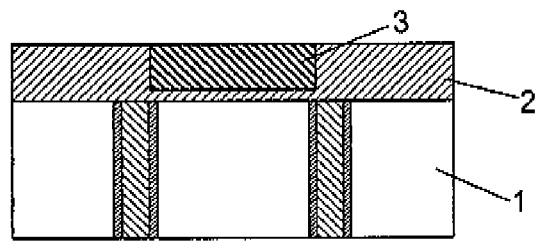

Finally, as shown in FIG. 7E, the bottom of the insulating ring 23 is exposed by grinding the silicon substrate 1 at the opposite surface to the surface where the first insulating film 2 and the pad 3 are formed. For example, the silicon substrate 1 is ground such that the thickness becomes 40 μm.

Thereafter, the device shown in FIG. 6 is completed by forming the second insulating film 4 on the opposite side of the silicon substrate, forming the TSV, forming the metal film 6 composed of the barrier metal and the seed metal, and forming the first plated film 7 and the second plated film 8, similar to the first exemplary embodiment, except for forming the third insulating film 5.

Insulation and anti-diffusion of metal atoms are improved by using the insulating ring, as described above. Further, it is possible to reduce parasitic capacitance. Further, it is possible to improve electrical isolation of the through-electrode from the devices and wires on the silicon substrate by disposing the insulating ring outside the peripheries of the pad and the bump.

Meanwhile, the present invention is not limited to the circular ring shown in the plan view of FIG. 6B, other-shaped insulating ring, such as a rectangle, can be used. Further, the insulating ring is not limited to a single fold ring and multi-fold rings can be used.

Although the above examples are related to an example of forming a through-hole reaching the conductive layer (pad 3), which extends in the plane direction on the first insulating layer 2 on one surface of the silicon substrate, from the other surface of the silicon substrate, the present invention can be applied to when a through-hole is formed to be connected to a conductive plug extending perpendicular to the surface of the silicon substrate in the first insulating film or another insulating film disposed above the first insulating film 2, in which the same effect is achieved.

Modified Embodiment

Figure 8:
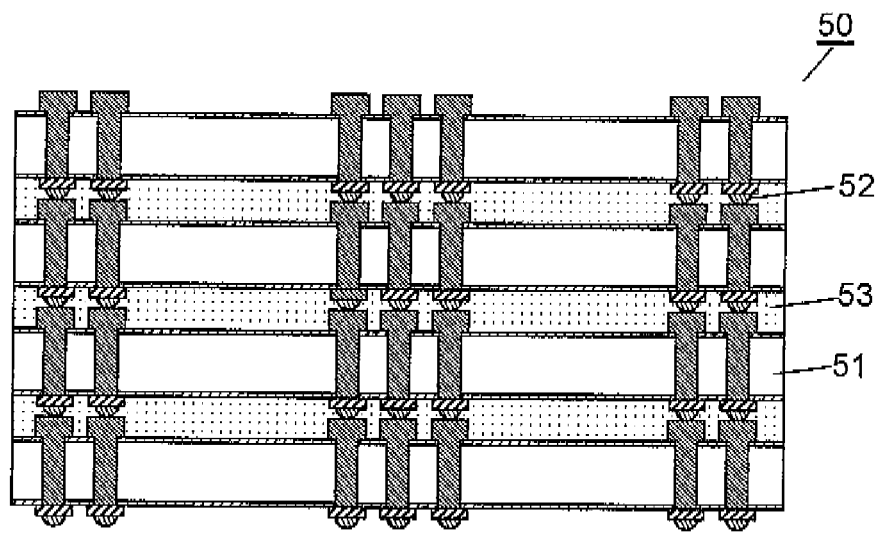
FIG. 8 is a schematic cross-sectional view showing an application example of a semiconductor device of the present invention in which an example of a stacking module is shown.
Figure 9:
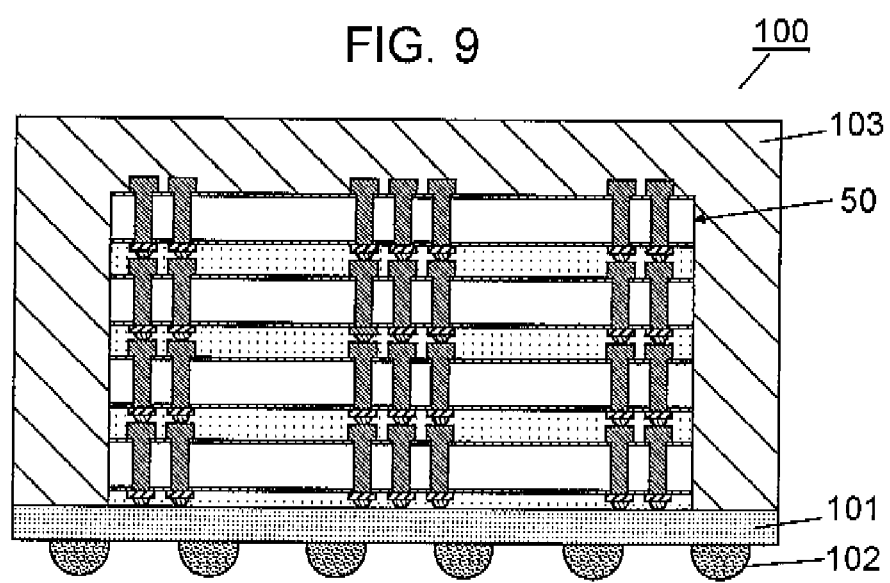
FIG. 9 is a schematic cross-sectional view showing an application example of a semiconductor device of the present invention in which an example of a package using the stacking module of FIG. 8 is shown.

FIG. 8 and FIG. 9 show a modified example of a semiconductor device of the present invention.

FIG. 8 is a schematic cross-sectional view showing a stacking module 50 formed by stacking a plurality of semiconductor chips 51 of the present invention, with which a pad of one semiconductor chip is electrically connected to a bump portion in a bump-integrated through-electrode of another chip. The pad of the upper semiconductor chip is connected to the bump portion of the lower semiconductor chip via a connection terminal 52, such as BGA. Further, an insulating material 53 is under-filled between the chips, for insulation.

FIG. 9 shows a package 100 equipped with the stacking module 50 formed as described above on a circuit board 101, and sealed with mold resin 103. A plurality of wire layers (not shown) is formed in the circuit board 101 and stacked such that the width and the gap increase downward. Reference numeral '102' indicates an external terminal, such as a BGA, which allows the package 100 to be mounted on a mother board (not shown).

The present invention additionally includes the following embodiments.

I. A semiconductor device including: a conductive layer formed over one surface of a semiconductor substrate with an insulating layer therebetween; a through-electrode portion provided in a through-hole from one surface of the semiconductor substrate to the other surface to be electrically connected with the conductive layer; and a bump portion formed at the other surface of the semiconductor substrate, in which the through-electrode portion has a shape of which the cross-sectional area parallel with the substrate surface is smaller than the cross-sectional are parallel with the substrate surface of the bump portion and the bump portion includes a first bump portion integrally formed with the through-electrode portion.

II. The semiconductor device of Item I, in which the through-electrode and the bump portion has different cross-sectional shapes that are parallel with the substrate surfaces.

III. The semiconductor device of Item I or II, in the side of the bump portion is substantially perpendicular to the substrate surface.

IV. The semiconductor device of Items I to III, in which the surface of the bump portion is substantially flat.

V. The semiconductor device of Items I to IV, including a seed metal layer on the side and the bottom of the through-electrode portion and the seed metal layer extending above the surface of the semiconductor substrate under the first bump portion.

VI. The semiconductor device of Items I to V, in which the bump portion includes the first bump portion integrally formed with the through-electrode portion and a second bump portion comprising a different material on the first bump portion.

VII. The semiconductor device of Item VI, in which the through-electrode portion and the first bump portion comprise copper, which is a main component, and the second bump portion comprises an alloy containing nickel and gold, an alloy containing nickel, lead, and gold, an alloy containing tin and silver, or a lead-free solder.

VIII. The semiconductor device of Items I to VII, in which the through-electrode portion and the bump portion is insulated from the semiconductor substrate by an insulating film formed under the bump portion and the side of the through-electrode.

IX. The semiconductor device of Items I to VIII, the through-electrode portion is in contact with the semiconductor substrate, and the through-electrode portion and the bump portion are at least insulated from the semiconductor substrate around an insulating portion which is formed through the semiconductor substrate around the portion separated from the through-electrode.

What is claimed is:

1. A method for manufacturing a semiconductor device including a first semiconductor chip and a second semiconductor chip, comprising:
   forming each of the first and second semiconductor chips by:
      forming a trench on one surface of a semiconductor substrate, the trench being connected to a conductive layer formed over the other surface of the semiconductor substrate, and an insulating layer being interposed between the conductive layer and the semiconductor substrate;
      depositing a seed metal layer on the one surface of the semiconductor substrate and on an inner surface of the trench;
      forming a plating mask layer having an opening larger than the trench in diameter and exposing an opening of the trench on the one surface of the semiconductor substrate; and
      growing a first plated film in the trench and the opening of the plating mask layer by electrolytic plating using the plating mask layer as a mask so as to integrally form a first portion including an embedded portion in the trench and a second portion protruding from the one surface of the semiconductor substrate in the opening of the plating mask layer, wherein an uppermost surface of the first plated film protrudes from the one surface of the semiconductor substrate, and is substantially flat and continuous after growing of said first plated film; and
   stacking the first and second semiconductor chips, the first plated film of the first semiconductor chip being connected to a solder ball that directly contacts the conductive layer of the second semiconductor chip.

2. The method according to claim 1, wherein the forming a plating mask layer includes providing a photoresist film on the one surface of the semiconductor substrate, exposing the photoresist film to light and developing the photoresist film.

3. The method according to claim 2, wherein the developing the photoresist film includes removing the photoresist film being on the surface of the seed metal layer in the trench.

4. The method according to claim 3, wherein the developing the photoresist film includes a plurality of sets of steps for developing a photoresist performed successively, the unit set of steps for developing a photoresist includes a step of supplying a developer onto a substrate with a rotation of the substrate, a step of performing development with the rotation stopped and with the developer kept on the substrate, and a step of spinning out the developer from the substrate with a rotation of the substrate.

5. The method according to claim 4, wherein the concentration of the developer is reduced sequentially or step by step in each of the sets of steps for developing a photoresist.

6. The method according to claim 4, wherein the developing the photoresist includes at least one rinsing process between the sets of steps for developing a photoresist.

7. The method according to claim 1, wherein the growing a first plated film is performed under a film-growing condition: $d/r2 \leq R/r1$, where R and d are the radius and depth of the trench after the seed metal layer is formed, respectively, r1 is an average film-growing rate horizontally growing around the opening of the trench, and r2 is an average film-growing rate upwardly growing in the depth direction of the trench.

8. The method according to claim 7, further comprising growing an additional plated film made of the same material as the first plated film on the first plated film under a film-growing condition different from the film-growing condition of the first plated film.

9. The method according to claim 1, wherein the growing a first plated film is performed under a film-growing condition in which a film-growing rate for growing the first plated film upward from the bottom of the trench reaches the substrate surface before the opening of the trench is closed by the first plated film horizontally growing around the opening of the trench.

10. The method according to claim 1, further comprising forming a second plated film with a different material from the first plated film on the first plated film.

11. The method according to claim 1, further comprising forming an insulating film on the side surface of the trench before the forming a seed metal layer.

12. A method for manufacturing a semiconductor device including a first semiconductor chip and a second semiconductor chip, comprising:
   forming the first semiconductor chip by:
      forming a trench on a surface of a semiconductor substrate,
      depositing a seed metal layer on the surface of the semiconductor substrate and on an inner surface of the trench, and
      forming an electrode that comprises a single piece of conductive material including a first portion and a second portion by electrolytic plating, the first portion including an embedded portion in the trench, the second portion protruding from the surface of the semiconductor substrate, wherein the first portion of the electrode is formed under a film-growing condition $d/r2 \leq R/r1$, where R and d are a radius and depth of the trench after the seed metal layer is formed, respectively, r1 is an average film-growing rate horizontally growing around an opening of the trench, and r2 is an average film-growing rate upwardly growing in the depth direction of the trench, and wherein an uppermost surface of the second portion is substantially flat and continuous after forming the electrode; and
   stacking the first and second semiconductor chips, the second portion of the conductive material of the first semiconductor chip being connected to a solder ball that directly contacts the second semiconductor chip.

13. The method according to claim 12, wherein the forming the electrode comprises forming the first portion of the electrode under a film-growing condition in which a film-growing rate for growing a conductor upward from the bottom of the trench reaches the substrate surface before an opening of the trench is closed by the conductive material horizontally growing around the opening of the trench.

14. The method according to claim 12, wherein the forming the electrode further comprises growing the conductive material including the same material as the first portion of the electrode as a main component under a film-growing condition different from the film-growing condition under which the forming the first portion of the electrode is performed, successively after the forming the first portion of the electrode.

15. The method according to claim 12, further comprising forming a plating mask layer having an opening larger than the trench in diameter and exposing an opening of the trench before the forming the electrode, wherein the forming the electrode comprises growing a conductive material in the trench and the opening of the plating mask layer by electrolytic plating using the plating mask layer as a mask so as to integrally form the first portion including an embedded portion in the trench and the second portion in the opening of the plating mask layer.

* * * * *